United States Patent

[11] 3,602,774

[72] Inventors John Grant
Contoocook;
Miner R. Longley, Pembroke, both of, N.H.
[21] Appl. No. 34,747
[22] Filed May 5, 1970
[45] Patented Aug. 31, 1971
[73] Assignee Aerotronic Associates, Inc.
Contoocook, N.H.

[54] METHOD AND APPARATUS FOR SUPPORTING A PLURALITY OF PRINTED CIRCUIT BOARDS FOR LIFE TEST AND BURN-IN
9 Claims, 6 Drawing Figs.

[52] U.S. Cl. .......... 317/100, 317/99, 317/101 DH
[51] Int. Cl. .......... H05k 7/20, H05k 5/02
[50] Field of Search .......... 174/16; 211/1, 26, 177; 317/99, 100, 101 DH

[56] References Cited

UNITED STATES PATENTS

| | | | |
|---|---|---|---|
| 2,951,185 | 8/1960 | Buck | 317/101 DH |
| 3,434,014 | 3/1969 | Taynton | 317/99 |

FOREIGN PATENTS

| | | | |
|---|---|---|---|
| 376,978 | 6/1964 | Switzerland | 317/100 |

*Primary Examiner*—Lewis H. Myers
*Assistant Examiner*—Gerald P. Tolin
*Attorney*—David H. Semmes

ABSTRACT: Method for supporting a plurality of printed circuit boards in superposed relationship for life test and burn-in, such that the power dissipating load resistors of the trays are eliminated from thermal interaction with the devices under test. The trays are vertically staggered with the semiconductors under test being exposed outwardly in ambient air and the power dissipating load resistors being exposed inwardly. The heat from the power dissipating load resistors rises vertically with entrained air within the load. Since the boards are vertically staggered, fresh ambient air is entrained at each level with the result that each board is thermally isolated from the other.

INVENTORS
JOHN GRANT
MINER R. LONGLEY
BY David H. Semmes
ATTORNEY

INVENTORS
JOHN GRANT
MINER L. LONGLEY
BY
David H. Semmes
ATTORNEY

INVENTORS
JOHN GRANT
MINER R. LONGLEY
BY David H. Semmes
ATTORNEY

METHOD AND APPARATUS FOR SUPPORTING A PLURALITY OF PRINTED CIRCUIT BOARDS FOR LIFE TEST AND BURN-IN

CROSS-REFERENCES TO RELATED APPLICATIONS

Method for supporting printed circuit boards of the type disclosed in Assignee's earlier filed application entitled: "Integrated Circuit Test System," filed Mar. 27, 1970, Ser. No. 23,351.

In the earlier application trays are constructed so that they may support printed circuit boards with their semiconductor elements within a life test or burn-in oven. In the present system, the trays support the printed circuit boards under ambient conditions such that the semiconductors under test are exposed outwardly of a hood and the power dissipating resistors or load circuitry is presented inwardly of the hood for exposure to entrained air.

BACKGROUND OF THE INVENTION

In some types of military life test and burn-in systems elevated temperatures are employed with the requirement that ambient air, rather than heated air is required to be exposed to the semiconductor device under test. In conventional life test and burn-in ovens the heat generated by the semiconductors under test and their load resistors is contained within the oven during the entire life test and burn-in. As a consequence, the semiconductors are exposed to heat dissipated not only by the load resistors on their own board, but the combined total of the heat dissipated by resistors on other boards. The inverse effects of radiation and convection combine to subject the boards to a heat factor considerably in excess of designed load.

According to the present invention, natural air convection is employed to carry the heat dissipated by each test board away from the board vertically and without exposure to other boards with the result that each board is isolated thermally from adjacent boards. As a result each board is cooled by natural air convection.

THE PRIOR ART

Earlier inventors have adapted related structures for supporting printed circuit subassemblies and also for burning-in such printed circuits Buck Pat. No. 2,951,185 generally teaches the concept of supporting printed circuit subassemblies and test fixtures as a tray. Note Buck's claim 1 which broadly relates to the supporting of such printed circuits. Suverkropp Pat. No. 3,133,180 supports his trays 21 and circuit components within an oven for testing. Humphreys Pat. No. 3,009,102 (column 1, line 36–41) discusses his oven for testing a plurality of insulator resistances or like components. Scherb's Pat. No. 3,151,279 is also a test fixture for holding circuit components for testing such as high and low temperature cycling, baking and the like.

The prior art shows a plurality of burn-in type ovens wherein the printed circuit boards are supported one upon the other and the heat radiated from the power dissipating devices is exposed to adjacent boards. As a consequence, the boards are subjected to a super abundant heat factor far in excess of the designed load. The present system eliminates this buildup by subjecting the boards only to entrained ambient air, while avoiding thermal interaction between boards.

SUMMARY OF THE INVENTION

According to the present method, a plurality of printed circuit boards are supported in superposed relationship such that their power dissipating load resistor surfaces are presented on one side within a hood or flue and the semiconductors being tested are exposed outwardly to ambient air. The boards are vertically staggered one above the other, such that ambient air may be entrained intermediate the exposed edges of adjacent boards and the entrained air, after exposure to the heat dissipating devices, rises thermally in its own plane within the hood. Modifications of invention include blowing of filtered air against the inner surfaces of the boards.

DESCRIPTION OF THE PREFERRED EMBODIMENTS

Figure 1:
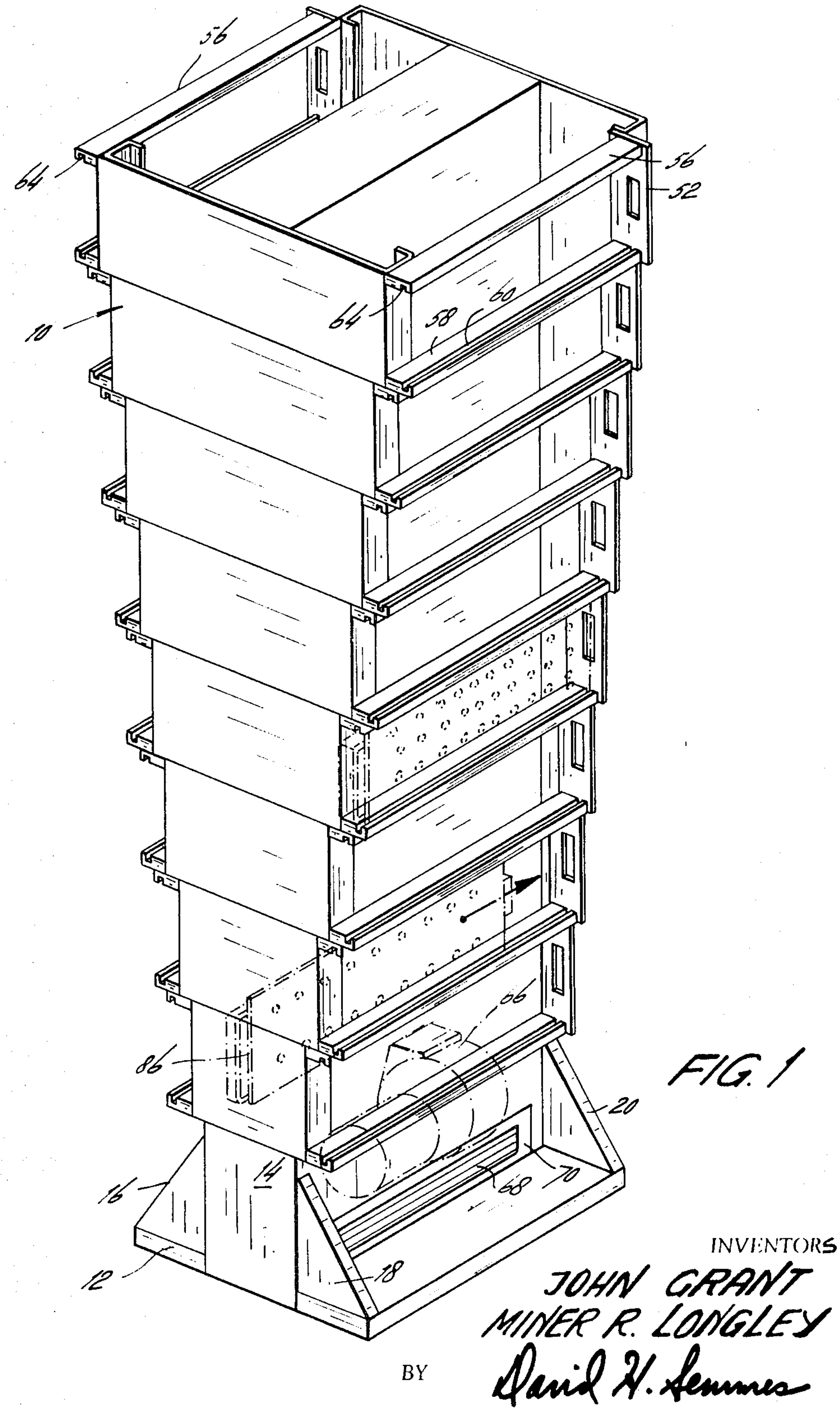
FIG. 1 is a perspective view of a system wherein a plurality of circuit boards are superposed and staggered, so as to entrain ambient air against the power dissipating inner surfaces of the boards.
Figures 2, 3:
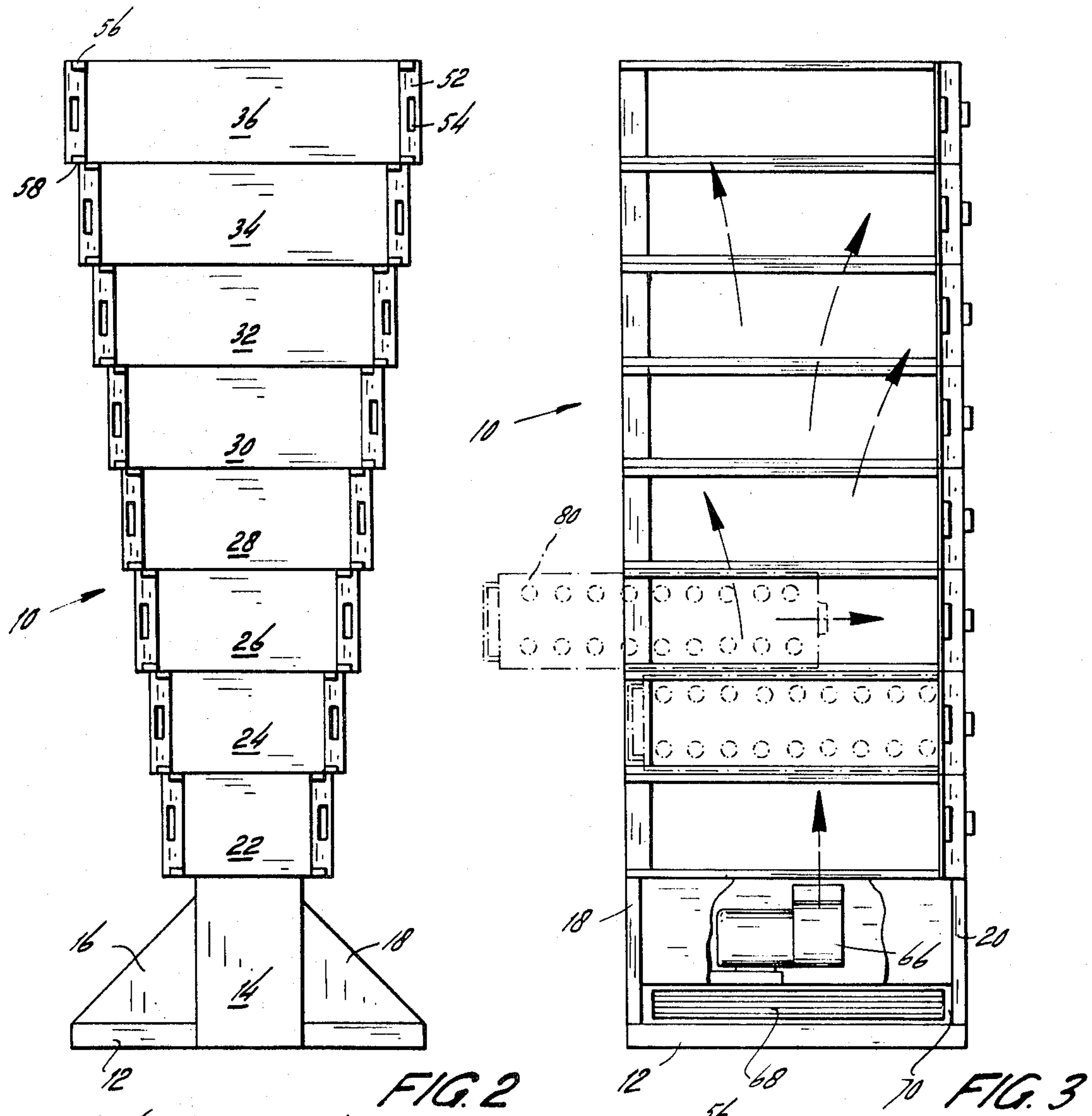
FIG. 2 is a side elevation.
FIG. 3 is a front elevation.
Figure 4:
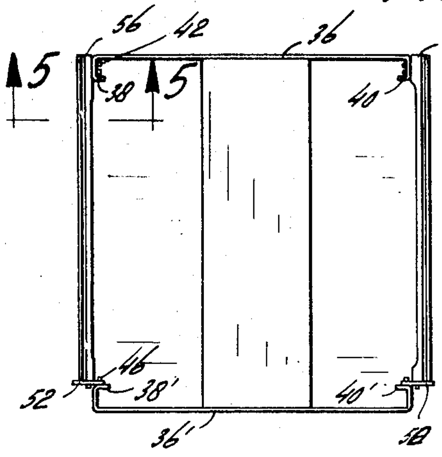
FIG. 4 is a top plan.
Figure 6:
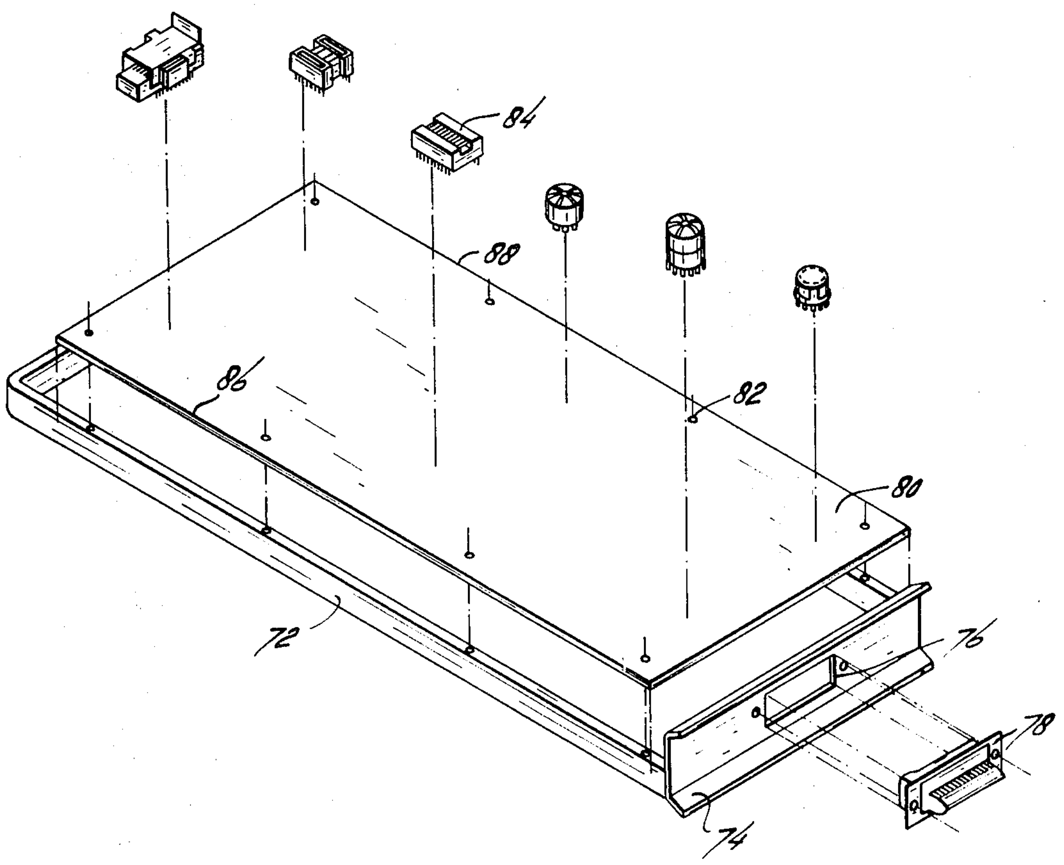
FIG. 6 is a perspective view of the type of test tray used under the present system.

In FIG. 1, a life test and burn-in system 10 is illustrated as comprised of base 12 having end panels 14 and 14' rigidized by means of triangular gussets 16 and 18. Pairs of end panels 22, 24, 26, 28, 30, 32, 34 and 36 of increasing width are mounted one upon the other, each pair having a top channel guide bracket 56 with guide channel 64 and a bottom bracket 58 with channel 60. The individual test trays are illustrated in FIG. 6 as comprised of U-shaped, bent aluminum frame 72 having endpiece 74 defining an aperture 76 in which a Blue Ribbon electrical connector 78 or the like may be secured and thereby bussed to the individual semiconductor elements 84 positioned for test upon circuit board 80. The board 80 may be secured to frame 72 by means of screws 82, such that its lateral edges 86 and 88 protrude beyond the frame and may thus engage top channel 64 and bottom channel 60, supporting the tray in insulated relationship with respect to the structure illustrated in FIG. 1. The Blue Ribbon connector 78 fits through aperture 54 in endpieces 52 for suitable electrical connection (not illustrated) during the burn-in.

An optional blower 66 may be mounted upon base 12 adjacent frame 70 and air filters 68, so as to create a slight negative pressure and, thus, assist in entraining ambient air.

Figure 5:
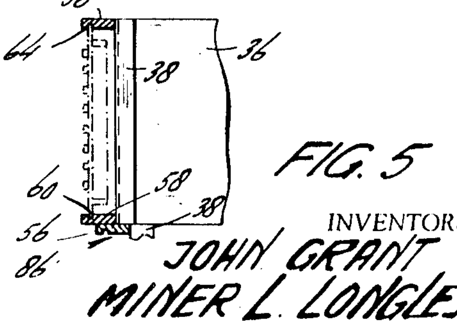
FIG. 5 is a fragmentary vertical section taken along section line 5—5 of FIG. 4.

As illustrated in FIG. 5, the individual boards are staggered by means of the top channels 56 and bottom channels 60 being offset, so as to define a lateral aperture 86 intermediate the adjacent edges of superposed boards. As a result, entrained ambient air enters lateral apertures 86, is exposed to the load dissipating elements on the inner side of the tray and thence flows vertically through the top of the hood without contacting the load dissipating devices on the upper boards.

According to the present method, as many as 1,600 diodes, transistors or other semiconductor devices may be subjected to simultaneous life test and burn-in. Each tray is isolated thermally from its adjacent tray enabling life test up to 150° C. The tray configuration may be varied to include fixed metallization the temperature may be increased and the mode of switching into the trays may be varied without departing from the spirit of invention.

I claim:

1. Method of supporting a plurality of printed circuit boards using power load circuitry and semiconductors for a life test and burn-in comprising:

A. supporting said circuit boards with their sides vertically aligned and in superposed relationship such that the semiconductors being tested are exposed on one side and the power load circuitry is exposed on another side; and B. vertically staggering said boards one above the other such that ambient air may be entrained intermediate the side edges of adjacent boards.

2. Method of supporting printed circuit boards as in claim 1, including:

C. staggering said boards laterally outwardly, such that the bottom board defines an inner entrainment axis and the edges of upper boards define increasingly outward entrainment axes.

3. Method of supporting printed circuit boards as in claim 2, including supporting pairs of circuit boards in superposed relationship such that the load circuitry is presented on their inner opposed sides and the semiconductors being tested are exposed outwardly, and vertically staggering the boards one above the other, such that ambient air may be entrained beneath the bottom edges of said boards and flow against the load circuitry on backs of said boards defining a flue and outwardly of the top.

4. Method of supporting printed circuit boards for a life test and burn-in system as in claim 3, including:

D. pulling ambient air, filtering said air at the bottom and then forcing said ambient air upwardly against the staggered backs of said boards.

5. A hood for supporting a plurality of printed circuit boards in superposed relationship comprising:

A. a base;

B. pairs of end baffles of increasing horizontal width mounted upon said base and successively one above the other, so as to define a plurality of staggered circuit board supporting brackets; and C. upper and lower slotted guides extending between the ends of said pairs of end baffles and defining channels for engaging the side edges of the circuit boards.

6. A hood as in claim 5, including a filter mounted upon said base beneath said bottom pair of baffles.

7. A hood as in claim 5, including a blower mounted inwardly of said filter upon said base so as to create a negative pressure within said hood.

8. A hood as in claim 5, including:

D. an electrical connecting bracket at one end of each pair of baffles, extending into a tray mounted positively in said guides.

9. In a hood as in claim 8 the combination of:

A. a printed circuit board tray of the type including a rectangular frame defining an electrical connector support at one end;

B. a printed circuit board mounted upon said frame so that its sides extend laterally thereof; and, said tray being mounted in one of said channels so that its electrical connector mates with said electrical connecting bracket in said pair of end baffles.